United States Patent [19]
Petersen et al.

[11] Patent Number: 5,609,939
[45] Date of Patent: Mar. 11, 1997

[54] VIEWING SCREEN FORMED USING COHERENT LIGHT

[75] Inventors: Joel Petersen, Valley Village; Jeremy Lerner, Culver City, both of Calif.

[73] Assignee: Physical Optics Corporation, Torrance, Calif.

[21] Appl. No.: 355,818

[22] Filed: Dec. 14, 1994

Related U.S. Application Data

[63] Continuation of Ser. No. 97,533, Jul. 27, 1993, abandoned.

[51] Int. Cl.$^6$ .............................. G03B 21/60; G03B 21/62
[52] U.S. Cl. .................. 428/141; 428/156; 428/418; 428/912.2; 428/913; 359/443; 359/454; 359/455; 359/456; 359/459; 359/460; 359/15; 359/599; 349/62
[58] Field of Search ...................................... 428/141, 156, 428/418, 912.2, 913; 359/443, 454, 455, 456, 459, 460, 15, 599, 49

[56] References Cited

U.S. PATENT DOCUMENTS

| | | | |
|---|---|---|---|
| 3,567,444 | 3/1971 | Shankoff | 350/3.5 |
| 3,619,021 | 11/1971 | Bledermann | 350/3.5 |
| 3,698,810 | 10/1972 | Bestenreiner et al. | 355/71 |
| 3,708,217 | 1/1973 | McMahon | 350/3.5 |
| 3,909,111 | 9/1975 | Meyerhofer | 350/117 |
| 3,996,051 | 12/1976 | Meyerhofer | 96/27 E |
| 4,006,965 | 2/1977 | Takada et al. | 350/117 |
| 4,040,717 | 8/1977 | Cinque et al. | 350/127 |
| 4,053,208 | 10/1977 | Kato et al. | 350/117 |
| 4,206,969 | 6/1980 | Cobb et al. | 350/126 |
| 4,268,118 | 5/1981 | Palmquist et al. | 350/128 |
| 4,290,696 | 9/1981 | Mould et al. | 356/300 |
| 4,309,093 | 1/1982 | Kuwayama et al. | 354/59 |
| 4,336,978 | 6/1987 | Suzuki | 350/167 |
| 4,427,265 | 1/1984 | Suzuki et al. | 350/321 |
| 4,428,648 | 1/1984 | Wiley | 350/238 |
| 4,481,414 | 11/1984 | Gasper | 250/226 |
| 4,523,807 | 6/1985 | Suzuki | 350/128 |
| 4,545,646 | 10/1985 | Chern et al. | 427/167 |
| 4,558,922 | 12/1985 | Smith | 350/127 |
| 4,567,123 | 1/1986 | Ohtaka et al. | 430/4 |
| 4,888,201 | 12/1989 | Veenvliet et al. | 427/38 |
| 4,968,117 | 11/1990 | Chern et al. | 350/174 |
| 5,046,793 | 9/1991 | Hockley et al. | 359/12 |
| 5,048,925 | 9/1991 | Gerritsen et al. | 359/569 |
| 5,365,354 | 11/1994 | Jannson et al. | 359/15 |

FOREIGN PATENT DOCUMENTS

| | | |
|---|---|---|
| 0479490A2 | 9/1991 | France. |
| 53-42726 | 4/1978 | Japan. |
| 53-51755 | 7/1978 | Japan. |
| 61-86221 | 5/1986 | Japan. |
| 62-12939 | 6/1987 | Japan. |

OTHER PUBLICATIONS

Dialog, JPO & JAPIO Database, Accession No. 00240726, (i.e., record including an English language abstract for JP 53042726 A), dated Jun. 17, 1978.
D. Meyerhofer "Holographic & Inter Verometric Viewing Screens", Applied Optics vol. 12 (1973) p. 2180.

*Primary Examiner*—William Watkins
*Attorney, Agent, or Firm*—Nilles & Nilles, S.C.

[57] ABSTRACT

A viewing screen for incident light including a sheet of embossable material in which a first micro-sculpted surface relief structure that controls the direction in which light propagates has been formed by replicating in the sheet of embossable material a second micro-sculpted surface structure that controls the direction in which light propagates, the second micro-sculpted surface structure having been formed in a photosensitive medium having a refractive index by (i) generating random, disordered and non-planar speckle in the photosensitive medium with coherent light which has been diffused through a holographic diffuser so as to define non-discontinuous and smoothly varying changes in the refractive index of the photosensitive medium which scatter collimated light into a controlled pattern with smooth brightness variation and (ii) developing the photosensitive medium, the incident light being incident on and returned from the viewing screen to a viewing area, the viewing screen controlling the direction of the incident light that is emanating from the viewing screen to the viewing area and increasing brightness in the viewing area relative to an area outside the viewing area.

20 Claims, 9 Drawing Sheets

VIEWING SCREEN FORMED USING COHERENT LIGHT

This application is a continuation, of application Ser. No. 08/097,533, filed Jul. 27, 1993, now abandoned.

BACKGROUND OF THE INVENTION

1. Field of the Invention

This invention pertains to viewing screens. More particularly, this invention pertains to viewing screens which increase brightness or gain in a predefined viewing area.

2. Description of the Prior Art

Viewing screens are used both in reflection and in transmission. In reflection, a viewing screen is typically made of a reflective flexible material that may be rolled up and stored when not in use. This type of screen is typically found in auditoriums, conference rooms, and residences where the screen is not in use frequently and is stored much of the time. In movie theatres, on the other hand, the reflective screen is usually secured to the front wall of the theatre.

In transmission, a typical viewing screen is of the "light box" type upon which the images, such as those from a slide projector, are incident, and the images are viewed from the opposite side of the screen. Transmissive viewing screens are typically made of a lenticular (or acetate) sheet which has numerous small lens-type structures machined in the screen. Another type of transmissive viewing screen is that found on large screen TVs which often have machined or formed therein a vertically oriented corrugated structure to permit wide angle viewing.

Each of these prior art viewing screens has significant shortcomings. First, particularly with respect to transmissive screens, their surface structure size is macroscopic leading to poor resolution if the size of the smallest elements of the image to be transmitted are smaller than the size of the surface structure of the screen. Furthermore, stronger and more expensive light sources must be used to generate sufficient brightness on the viewing side of the transmissive screen to offset low screen efficiency.

Second, prior art viewing screens generally do not have controllable fields of view and waste light energy by directing light into areas from which the screen is not viewed. Those that are controllable, such as lenticular screens, have large grain structure making them unsuitable for certain applications, such as HDTV (high definition television).

SUMMARY OF THE INVENTION

A high-brightness directional viewing screen is presented. Specifically, a viewing screen having an output directed toward a predefined viewing area and providing high brightness is disclosed. The viewing screen of the present invention has a micro-sculpted surface relief structure therein which increases brightness in a predefined viewing area by controlling the direction in which light emanates from the screen. The screen works either in reflection or transmission in a wide variety of viewing situations such as viewing slides, television, overhead transparencies, liquid crystal displays, microscope projection screens, and many others.

A method by which the viewing screen of the claimed invention is made comprises the steps of generating a surface structure in a photosensitive medium using coherent light, processing the medium, and replicating the surface structure in epoxy. The surface structure may be generated in the photosensitive medium by exposing it to coherent light which has been diffused. The light may be diffused by a ground glass, holographic, lenticular, or acetate diffuser, for example. The photosensitive medium may comprise dichromated gelatin, photoresist, silver halide, or photopolymer, for example. Once the photosensitive medium is recorded and processed, any of a number of types of epoxy may be applied thereto to transfer the surface structure into the epoxy, which, when cured, may be separated from the medium. The cured epoxy layer may be used, as is, in a transmission application or coated with a reflective material for a reflection application. For mass production, the epoxy layer may be subjected to electroform processes to create a metal master from which plastic, or other embossable materials, may be imprinted with the sculpted surface structure.

The surface structure on the viewing screen of the present invention returns images projected thereon in such a way that the image is viewable in a well-defined field of view in a horizontal direction for the widest possible field of view. The brightness and resolution in this field of view is significantly increased because of the highly efficient micro-sculpted surface structure of the viewing screen and because light is not returned to areas where there are no viewers. The image preferably is not returned to the upper and lower extremes in the vertical direction, thus directing the light in a predefined viewing area where the viewers are located.

DESCRIPTION OF THE PREFERRED EMBODIMENTS

Figure 1:
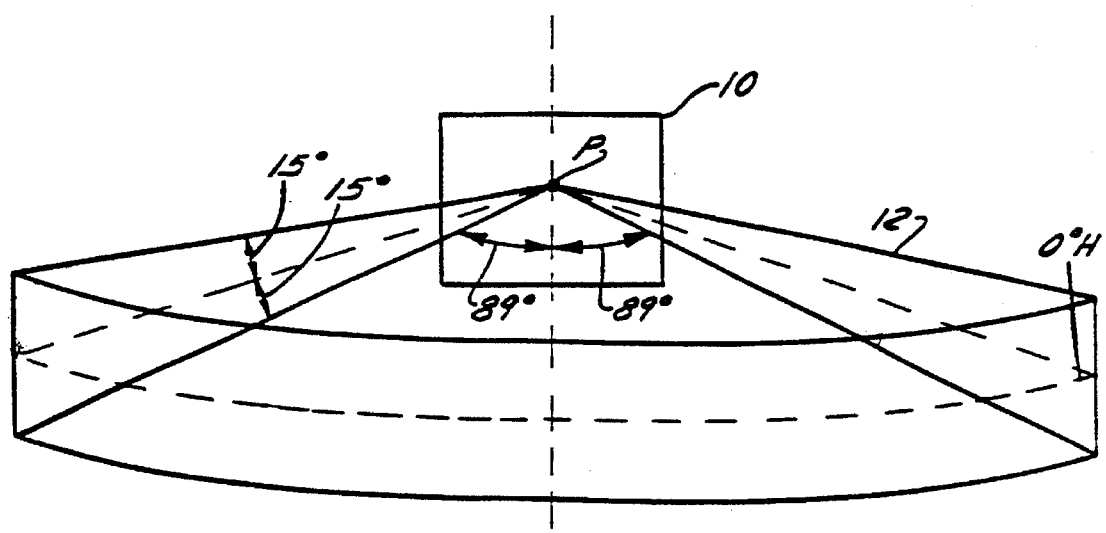
FIG. 1 is a schematic of a predefined viewing area of a viewing screen of the present invention.

Referring to FIG. 1, a viewing screen 10 of the present invention is shown having an exemplary predefined viewing area 12. Viewing screen 10 may comprise any number of embossable materials such as plastic containing a sculpted surface structure suitable for returning light incident thereon into a predefined viewing area 12. "Returned" light in this sense includes both light reflected from a reflective viewing screen into a predefined viewing area and light transmitted through a transmissive viewing screen into a predefined viewing area. The viewing screen 10 may be any size or shape desired and would depend on the confines of the area in which it is to be used. A transmissive viewing screen of the present invention may simply comprise a sheet of plastic or other embossable translucent material which has been embossed with a sculpted surface structure suitable for transmitting light into the predefined viewing area 12 or a glass substrate with an epoxy replication layer on it.

In a transmission application, an image projector, such as a slide projector or overhead projector, would be placed on one side of the viewing screen 10 and direct a light beam containing images onto that side. The viewing audience would be located on the opposite side of the viewing screen 10 and observe the images passing through the viewing screen 10 toward them.

As seen in FIG. 1, the exemplary predefined viewing area (taken with reference to a single point P on the screen) is a wedge shape extending 15° above and 15° below an imaginary horizontal plane ("0° H") running through the center of the viewing screen 10 at point P and extending 89° on either side of an imaginary vertical plane ("0° V") running through the center of the viewing screen 10 at point P. Thus, viewers within the predefined viewing area would be able to observe the images, while viewers outside that area would either not observe, or be able to observe only poor quality images because significantly reduced light intensity levels exist outside the predefined viewing area 12 as described below.

The surface structure in viewing screen 10 redirects light rays passing through the viewing screen 10 into the predefined viewing area 12 and does so highly efficiently. Light is actually redirected in the predefined viewing area so that light intensity within that area is higher than it would be without the screen of the present invention. In other words, brightness is significantly increased in the predefined viewing area 12.

In the case of a reflection viewing screen 10, a reflective coating such as aluminum is deposited on the surface of the viewing screen 10 to reflect light rays incident thereon in accordance with the sculpted surface structure. In a reflection application, the image source, such as a slide projector, is placed on the same side of the screen as is the viewer. Images in the light beam incident the viewing screen 10 are reflected back into the predefined viewing area toward the viewer. In FIG. 1, viewers sitting far off-center, i.e., off a vertical plane perpendicular through point P, will be able to view the image with virtually the same intensity as a viewer on-center. This desirable result is achieved because light is not returned into areas where there are no viewers and instead is redirected into the predefined viewing area increasing brightness in that entire area. FIG. 1 may also represent a standard large screen television. The viewing screen of the present invention, particularly the transmissive type, may be placed over, imbedded into, or actually replace the conventional viewing surface to achieve these desirable effects with much higher brightness and greater control over viewing area than was before possible.

The viewing screens of the present invention may also be used as microscope projection screens whereby the microscopic image is projected onto the viewing screen so that the image may be viewed on the screen rather than by looking into conventional microscope eye pieces. The surface structure in the screen may be chosen to direct the magnified image into a small viewing area to maximize brightness in that area.

Additionally, the viewing screen of the present invention may be used to view laser writing at large gatherings such as concerts to decrease the risk of injury caused by lasers projected into free space. In this application, lasers could be incident a reflective or transmissive viewing screen of the present invention which would direct the beams where desired. Additionally, the viewing screens of the present invention may be used on light emitting diode signs such as used in advertising and displays to increase viewing angle.

The viewing screens of the present invention may also be used with great advantage on laptop computers to direct light only at the user, thereby increasing brightness for the user. Consequently, privacy is ensured and less energy need be used to light the screen, increasing battery life.

The viewing screens of the present invention may also be used on security monitors to restrict the field of view to that immediately in front of the screen where security personnel are seated. In this way, secret or sensitive information may be viewed by security personnel but not by a person standing immediately next to him. There are virtually innumerable uses for the viewing screen of the present invention all of which need not be detailed here.

The preferred methods for making the viewing screens of the present invention are now described. Generally, the first step is to create a master diffuser, the second step is to record in a photosensitive medium with coherent light passed through the master diffuser, and the third step is to replicate the surface structure of the photosensitive medium with epoxy, for example. A fourth and optional step is to make a metal electroform master from the epoxy for mass production purposes. In the alternative, an electroform master may be made directly from the master diffuser.

Figure 2A:
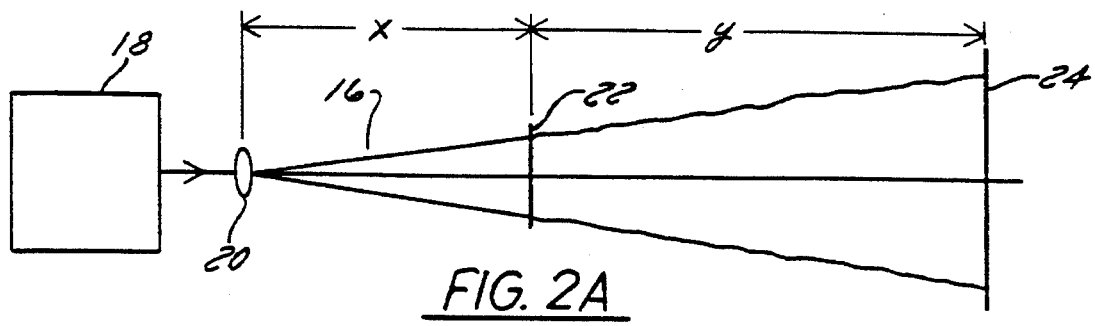
FIG. 2A is a recording set-up using an objective lens and a transmissive diffusing material used to record the photosensitive medium.

Referring to FIG. 2A, a recording set-up 16 is shown comprising a coherent laser light source 18, objective lens 20, master diffuser 22, and photosensitive medium 24. Coherent laser light source 18 is standard. The objective lens 20 is standard and may be a low or high magnification lens depending upon the desired characteristics of the photosensitive medium 24. The objective lens is spaced a distance X from the master diffuser 22. The master diffuser 22 may comprise a standard ground glass diffuser, a lenticular diffuser, an acetate diffuser, or a holographic diffuser. The ground glass, lenticular, and acetate diffusers are conventional and made in a conventional manner. If a holographic master diffuser is desired to be used, that master diffuser may itself first be recorded in the recording set-up shown in FIG. 2 with the holographic master diffuser to be recorded being positioned at 24 and a conventional ground glass diffuser, or other diffuser, being located at 22. That master diffuser may then be used to record into another photosensitive medium to be used as a viewing screen of the present invention.

A related set-up for recording volume holographic diffusers is described in co-pending application Ser. No. 848,703, filed Mar. 9, 1992, now U.S. Pat. No. 5,365,354, having a common assignee, the essentials of which are incorporated herein by reference. According to that disclosure, recording a holographic plate with coherent laser light passed through a conventional ground glass diffuser generates features called speckle in the volume of the hologram. This speckle is random, disordered and non-planar speckle that defines non-discontinuous and smoothly varying changes in the refractive index of the medium which scatter collimated light into a controlled pattern with smooth brightness variation. The size, shape, and orientation of the speckle can be adjusted which in turn affects the angular spectrum of light scattered from the holographic diffuser upon playback. Generally, the size of the angular spectrum of the scattered light, in other words, the angular distribution of the scattered light, depends on the average size and shape of the speckle. If the speckle are small, angular distribution will be broad. If the speckle size is horizontally elliptical, the shape of the angular distribution will be vertically elliptical. Thus, it is desirable to control the size and shape of speckle recorded in the medium so that, upon playback, the correct output or angular spread is produced.

Speckle size is inversely proportional to the size of the aperture of the master diffuser. If the size of the aperture increases, the size of the speckle decreases and the size of the angular spread of the scattered light from the recorded photosensitive medium increases. Conversely, if the size of the master diffuser aperture decreases, the size of the speckle recorded in the diffuser increases and the size of the angular spread of light scattered from the recorded photosensitive medium decreases. Thus, if the master diffuser aperture is long and narrow, the speckle will be long and narrow as well with their axes oriented perpendicularly to the axis of the aperture. This holds true for both volume holographic recording media as well as surface holographic recording media.

Diffusers made from volume holographic recording media as in Ser. No. 848,703, however, are disclosed there for their volume effect. In other words, the speckle recorded in the interior or volume of the medium was thought the only desired effect to be obtained from the material. However, since then we have discovered that recording a volume holographic photosensitive medium such as DCG (dichromated gelatin) in a similar recording set-up produces a surface effect of peaks and valleys which may be replicated as described below.

The size, shape and orientation of the surface features recorded in photosensitive medium 24 is a function of a number of variables including the type of objective lens 20 and master diffuser 22 used, as well as the relative positioning of those components with respect to each other and with respect to the photosensitive medium 24. Ultimately, the desired results are obtained through empirical testing. In order to achieve a recorded photosensitive medium having a particular surface structure that can be replicated and comprise a viewing screen of the present invention, it may be necessary to adjust the parameters discussed below to achieve the desired shape of the predefined viewing area as well as the increased brightness experienced by the viewer in that area.

The objective lens 20 expands the coherent laser light source 18 so that the area of incidence (or "apparent aperture") of light from the objective lens 20 on the master diffuser 22 is larger than that of the cross section of the laser beam itself. The light beam expands in accordance with the magnification of the objective lens 20.

Consequently, if a small magnification objective lens is used, such as 5X, the aperture of light incident the master diffuser 22 will be smaller than with a large magnification objective lens, such as 60X or greater, and therefore the size of the surface features recorded in the photosensitive medium 24 will be larger; the size of the aperture of light incident the master diffuser 22 is inversely related to the size of the surface features recorded in the photosensitive medium 24.

The distance between the objective lens 20 and the master diffuser 22 must also be taken into account in achieving the desired sculpted surface structure recorded in the photosensitive medium 24. As the distance between the objective lens 20 and the master diffuser 22 decreases, i.e., as X decreases, the size of the speckle increases. This occurs because as the objective lens 20 moves closer to the master diffuser 22, the apparent aperture of light incident the master diffuser 22 is smaller. Because the size of the speckle recorded in the photosensitive medium 24 is inversely related to the size of the apparent aperture on the master diffuser 22, the speckle will be larger. In turn, the increased speckle size recorded in the photosensitive medium 24 will result in a viewing screen which has decreased diffusion.

Conversely, if the distance X is increased, the apparent aperture of light incident the master diffuser 22 will increase, thus decreasing the size of the speckle recorded in the photosensitive medium 24 and in turn increasing the amount of angular spread of the viewing screen.

The distance Y between the master diffuser 22 and the photosensitive medium 24 also affects speckle size. As the distance Y decreases, the size of the speckle recorded in the photosensitive medium 24 decreases as well. This occurs because, assuming an expanded beam of light is produced at objective lens 20, as the photosensitive medium 24 is moved closer to the master diffuser 22, the light beam emanating from each of the irregularities in the master diffuser 22 will expand less by the time it reaches the photosensitive medium 24, thus producing smaller speckle. Conversely, if the distance Y is increased, the size of the speckle recorded will be increased. Thus, these simple relationships between the distances X, Y, and the magnification of the objective lens 20, are all adjusted, empirically, to achieve the size of speckle desired in the photosensitive medium 24.

Predefined output areas that are "off axis" with respect to the normal of the screen arreachieved by tilting the photosensitive medium 24 around an axis normal to its surface. For example, a 20° off-axis diffuser may be achieved by fitting the photosensitive medium 24 roughly 20°.

Figure 2B:
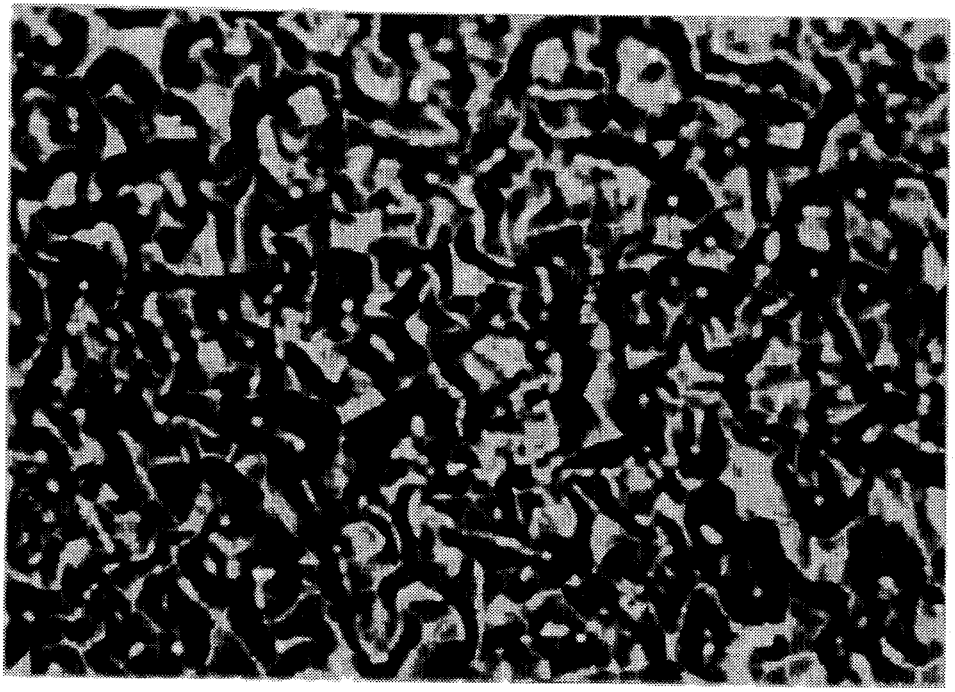
FIG. 2B is a photograph of the surface of a 20° circular screen magnified several hundred times.

Assuming that a ground glass diffuser is used as the master diffuser 22, the shape of the speckle recorded in photosensitive medium 24 will be roughly round as will the shape of the angular output of a screen made from photosensitive medium 24. FIG. 2B is a photograph of the surface of a screen having a round angular output. A round output may also be achieved if a lenticular or an acetate sheet is used as a master diffuser 22. Lenticular sheets have tiny lens-like elements machined in them. Acetate diffusers are made by an extrusion and embossing process which also yields roughly round speckle. It is difficult to create or control the desired irregularities in acetate diffusers. With respect to lenticular diffusers the surface effects necessary to achieve varying output shapes are complex machined macroscopic structures. If a prerecorded holographic master diffuser is used as the master diffuser 22, additional degrees of recording freedom are achieved because the master diffuser can be prerecorded with speckle having virtually any shape, size, and orientation as discussed further below. Speckle characteristics are more easily created and controlled using a holographic master diffuser.

In any case, in the recording set-up in FIG. 2A, the master diffuser must be able to transmit light so that it reaches the photosensitive medium 24 from the objective lens 20. Thus, if a substrate is needed as part of the master diffuser 22, such as if a holographic master diffuser is used, the substrate should be capable of efficiently transmitting light. A glass substrate is preferable. In addition to the additional degrees of freedom which can be achieved by using a prerecorded volume or surface hologram as the master diffuser 22, holographic master diffusers are preferable because better uniformity of intensity in the photosensitive medium 24 is achieved, higher transmission efficiency through the master diffuser 22 is achieved, and the holographic master diffuser 22 causes less back scatter than a ground glass diffuser. A first generation holographic volume master diffuser may be made using a ground glass or acetate diffuser. This holographic diffuser can then be used to make a second generation holographic master diffuser, either volume or surface, with greater control.

Figure 3:
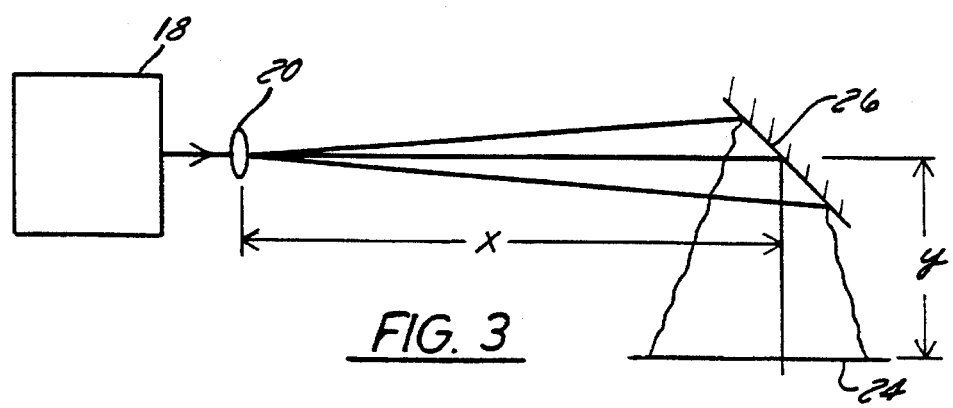
FIG. 3 is a recording set-up using an objective lens and a reflective diffusing material to record the photosensitive medium.

Referring now to FIG. 3, a reflection recording set-up for recording in a photosensitive medium 24 is depicted. Coherent laser light from light source 18 is incident the objective lens 20 which collimates and expands the light which is then incident upon reflective master diffuser 26 situated distance X from the objective lens 20. The light reflected from the reflective master diffuser 26 is then incident upon the photosensitive medium 24. The coherent laser light source 18, objective lens 20, and photosensitive medium 24 retain the same numerals as in FIG. 2A because they are the same elements. As in FIG. 2A, ground glass, lenticular, acetate, or volume holographic master diffusers may be used but, with the addition of a suitably front reflective surface so that light is not transmitted through master diffuser 26 but is reflected therefrom onto the photosensitive medium 24. Variations in the distance X, distance Y, and the magnification of the objective lens 20 have the same effect as described above with respect to the recording set-up in FIG. 2A.

The distinction between the viewing screen of the present invention and conventional viewing screens is highlighted further when one considers the ability to record surface features in the photosensitive medium which are not only round and produce round outputs as is conventionally found in ground glass, acetate, and lenticular diffusers, but which produce surface features, and therefore angular outputs, of any number of shapes not possible before, including off-axis outputs.

Figure 4:
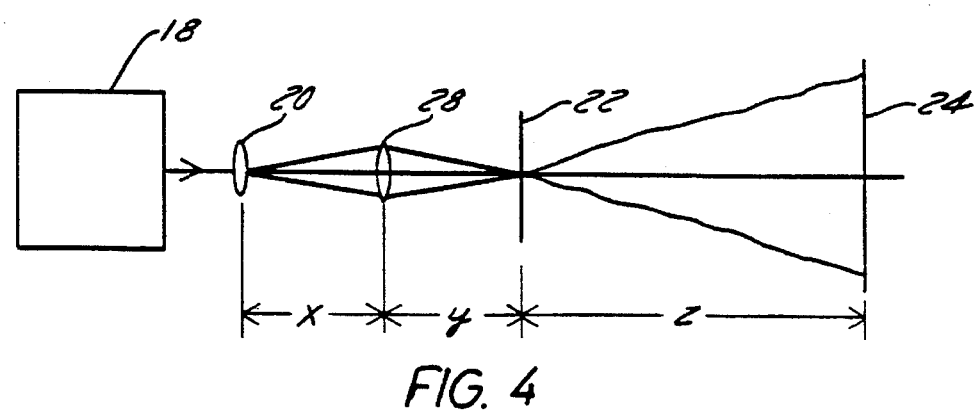
FIG. 4 is a recording set-up using two lenses and a transmissive diffusing material to record the photosensitive medium.
Figure 5A:
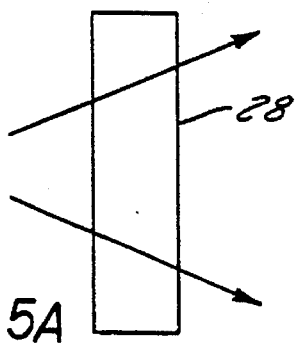
FIGS. 5A and B are schematics of light passing through a cylindrical lens.
Figure 5B:
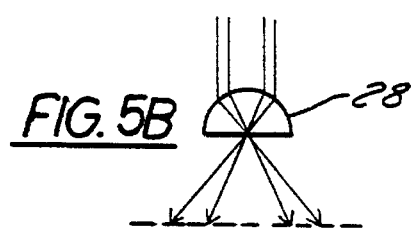

Referring now to FIG. 4, a recording set-up using an additional lens 28 with the coherent laser light source 18, objective lens 20, master diffuser 22, and photosensitive medium 24 is depicted in a transmission recording set-up. As can be appreciated, many different types of lenses can be used to shape the light beam from the coherent laser light source 18 before it reaches the master diffuser 22. Because the primary objective of the present invention is to achieve the desired sculpted surface structure in photosensitive medium 24 which will yield the desired angular spread, additional lens 28, which is positioned between the objective lens 20 and the master diffuser 22, may be chosen to produce the desired shape and orientation. In this case, additional lens 28 is a cylindrical lens which outputs diverging light rays in one direction as shown in FIG. 5A and light rays that converge to a line in another direction as shown in FIG. 5B. Thus, the light rays that are incident the master diffuser 22 in FIG. 4 are diverging with respect to each other in one direction and converging upon each other into a line in the perpendicular direction. Therefore, light rays passing through and exiting the master diffuser 22 on the side of the photosensitive medium 24, are likewise diverging more rapidly in a direction perpendicular to the line of light on the master diffuser than are the light rays that are parallel to that line.

Figure 6A:
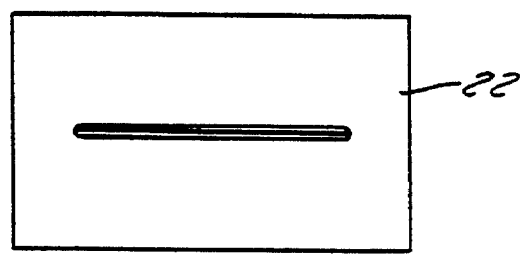
FIG. 6A depicts light incident on a master diffuser from a cylindrical lens.
Figure 6C:
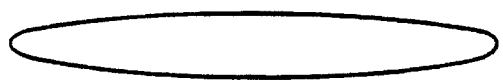
FIG. 6C depicts the angular output of a screen of the present invention.
Figure 6E:
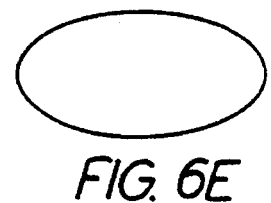
FIG. 6E depicts the angular output of a screen of the present invention.
Figure 6B:
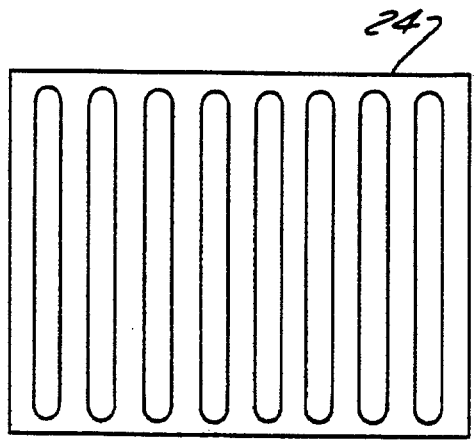
FIG. 6B depicts speckle recorded in a photosensitive medium using a cylindrical lens.
Figure 6D:
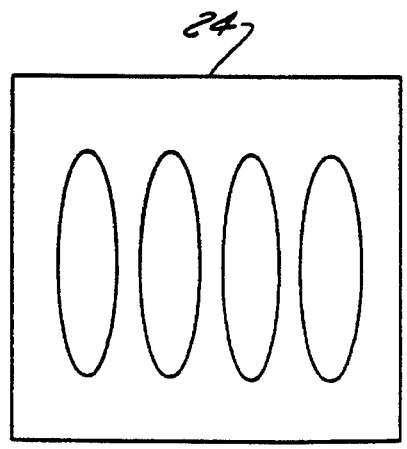
FIG. 6D depicts speckle recorded in a photosensitive medium.
Figure 6F:
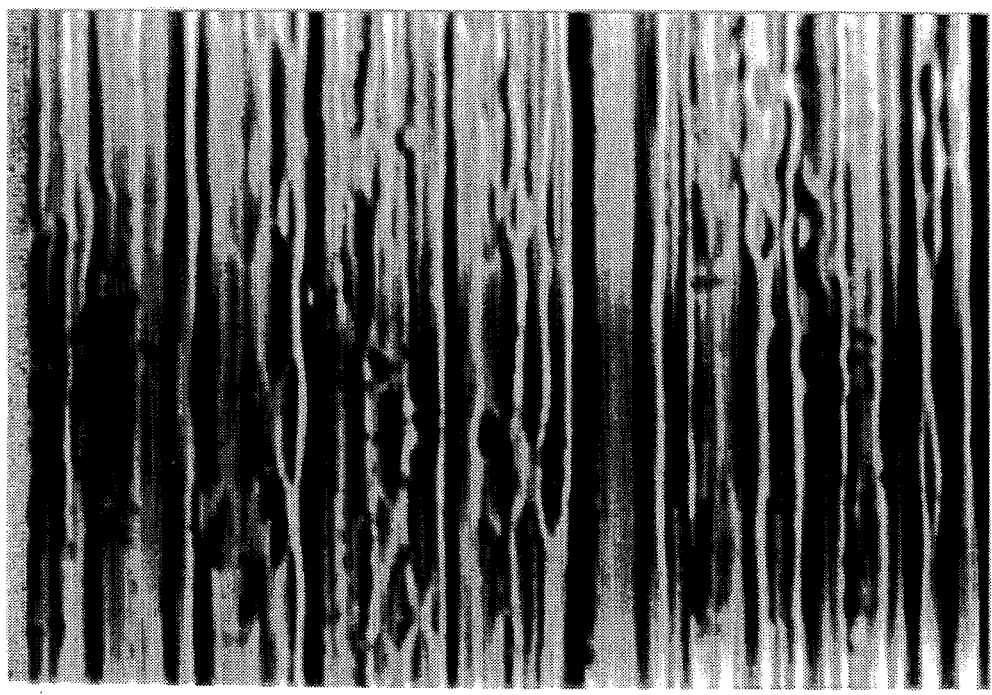
FIG. 6F is a photograph of the surface of a screen of the present invention.

In the recording set-up of FIG. 4, the master diffuser may preferably be near or at the focal point of the cylindrical lens 28. If the master diffuser 22 is at the focal point of the cylindrical lens 28, the maximum effect from the cylindrical lens will be achieved. That effect can be likened to stretching the speckle which are recorded in the photosensitive medium 24 in one direction. As a result, the speckle recorded in photosensitive medium 24 in the recording set-up in FIG. 4 will be long in one direction and short in the perpendicular direction taking on roughly the shape of the "line" shaped light beams produced by cylindrical lens 28, but oriented at 90° thereto. FIG. 6A shows light incident on the master diffuser 22 from the cylindrical lens 28, which is aligned in a horizontal direction. The speckle recorded in the photosensitive medium 24 will have an orientation 90° to this horizontal line as seen in FIG. 6B and produce a narrow, long angular output as shown in FIG. 6C. If the master diffuser 22 is at the focal point of the cylindrical lens 28, the degree of stretch of the speckle shown in FIG. 6B will be at its maximum. If the master diffuser 22 is placed on either side of the focal point of the lens 28, the speckle will tend to be shorter in the vertical direction and wider in the horizontal direction as seen in FIG. 6D and produce a slightly wider, shorter angular output as shown in FIG. 6E. FIG. 6F is a photograph of the surface of such a screen magnified several hundred times. The elongated surface features, which appear to be peaks and valleys, are visible.

As also seen in FIG. 4, the objective lens 20 and cylindrical lens 28 are separated by the distance X, the cylindrical lens 28 and the master diffuser 22 are separated by the distance Y, and the master diffuser 22 and the photosensitive medium 24 are separated by the distance Z. As in the above recording set-ups, if X is increased, the size of the speckle decreases. If Z is increased, the size of the speckle increases. If Y equals the focal length of the cylindrical lens, which is the smallest aperture, the speckle will be larger than if the master diffuser 22 is off the focal length in either direction.

Figure 7:
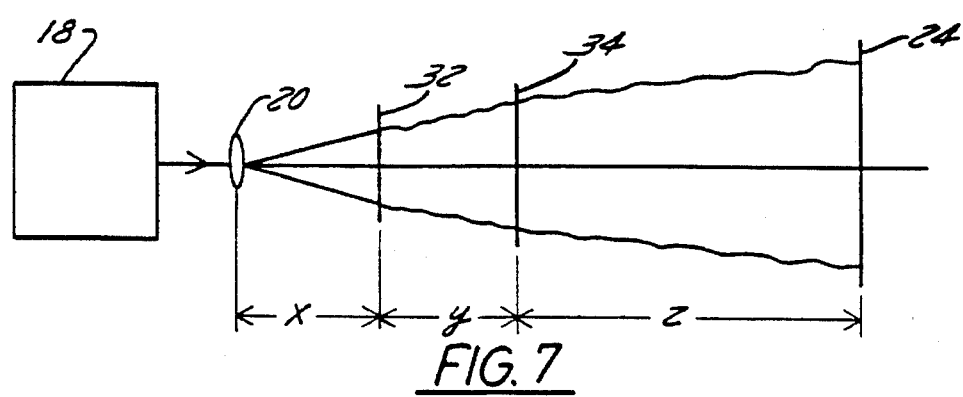
FIG. 7 is a recording set-up using an objective lens and two holographic diffusers to record the photosensitive medium.

The photosensitive medium 24 recorded with the vertically oriented line-like speckles in the recording set-up of FIG. 4 can then be replicated as described below and used as a viewing screen of the present invention, or may itself be used as a master diffuser in another recording set-up to achieve additional degrees of freedom as is seen in FIG. 7. If the recorded photosensitive medium is used as a master diffuser for subsequent recordings, it may be unnecessary to use lens 28 because the master diffuser will create the desired elliptical speckle in the photosensitive medium 24.

Referring now to FIG. 7, there is depicted a coherent laser light source 18, objective lens 20, and a photosensitive medium 24 similar to those in the previous drawings. Also depicted is a first master diffuser 32 and a second master diffuser 34. The recording set-up in FIG. 7 is preferred where the least amount of back scatter, the greatest amount of transmission efficiency, and the greatest uniformity of intensity is desired. By using two master diffusers prerecorded with elliptical speckle oriented in the same direction in both master diffusers 32 and 34, elliptical speckle are generated in the photosensitive medium 24 which have better intensity than can be recorded with one master diffuser. Furthermore, recording media of larger surface area are made possible by using two master diffusers. Finally, a cylindrical lens need not be used.

Figure 8A:
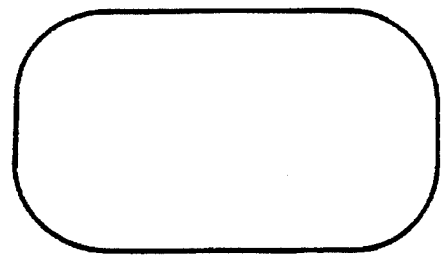
FIGS. 8A and B depict the angular output of screens of the present invention recorded sequentially with elongated elliptical speckle in one direction and elongated elliptical speckle in a perpendicular direction.
Figure 8B:
FIG. 8C is a photograph of the surface of a viewing screen of the present invention having a rectangular output.
Figure 8C:
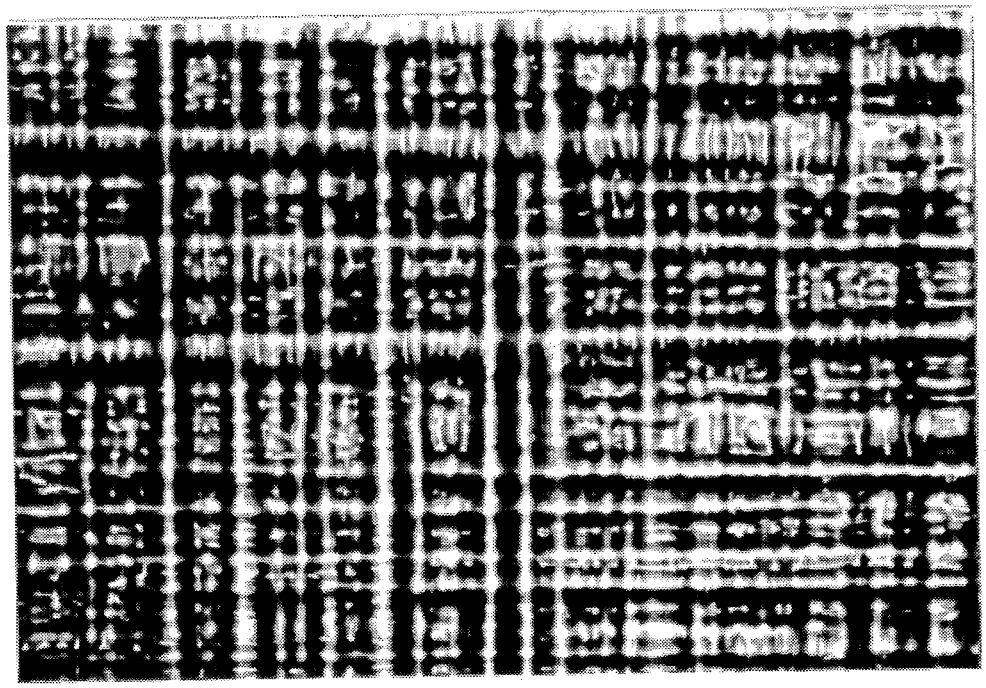

The output in FIG. 8A is rectangular and produced by recording in the same photosensitive medium elongated elliptical speckle in the horizontal direction and elongated elliptical speckle of a slightly lesser degree in the vertical direction. These two recordings may be accomplished sequentially using either volume holographic master diffusers prerecorded with elliptical speckle or a cylindrical lens and a conventional diffuser having a circular distribution, or other combinations of lens and master diffusers. FIG. 8B shows an output having roughly the same full width half maximum (FWHM) in the horizontal direction as in FIG. 8A but an FWHM in the vertical direction reduced by roughly a factor of 2. Angular output was measured at FWHM which is a measurement of angular spread of the output from the screen at all peripheral points which are at one-half the intensity of light passing through the center of the screen. The sculpted surface features of the screen having the output shown in FIG. 8A is best described by two perpendicular, intersecting sets of peaks and valleys in the surface as seen in the photograph of FIG. 8C.

Figure 9A:
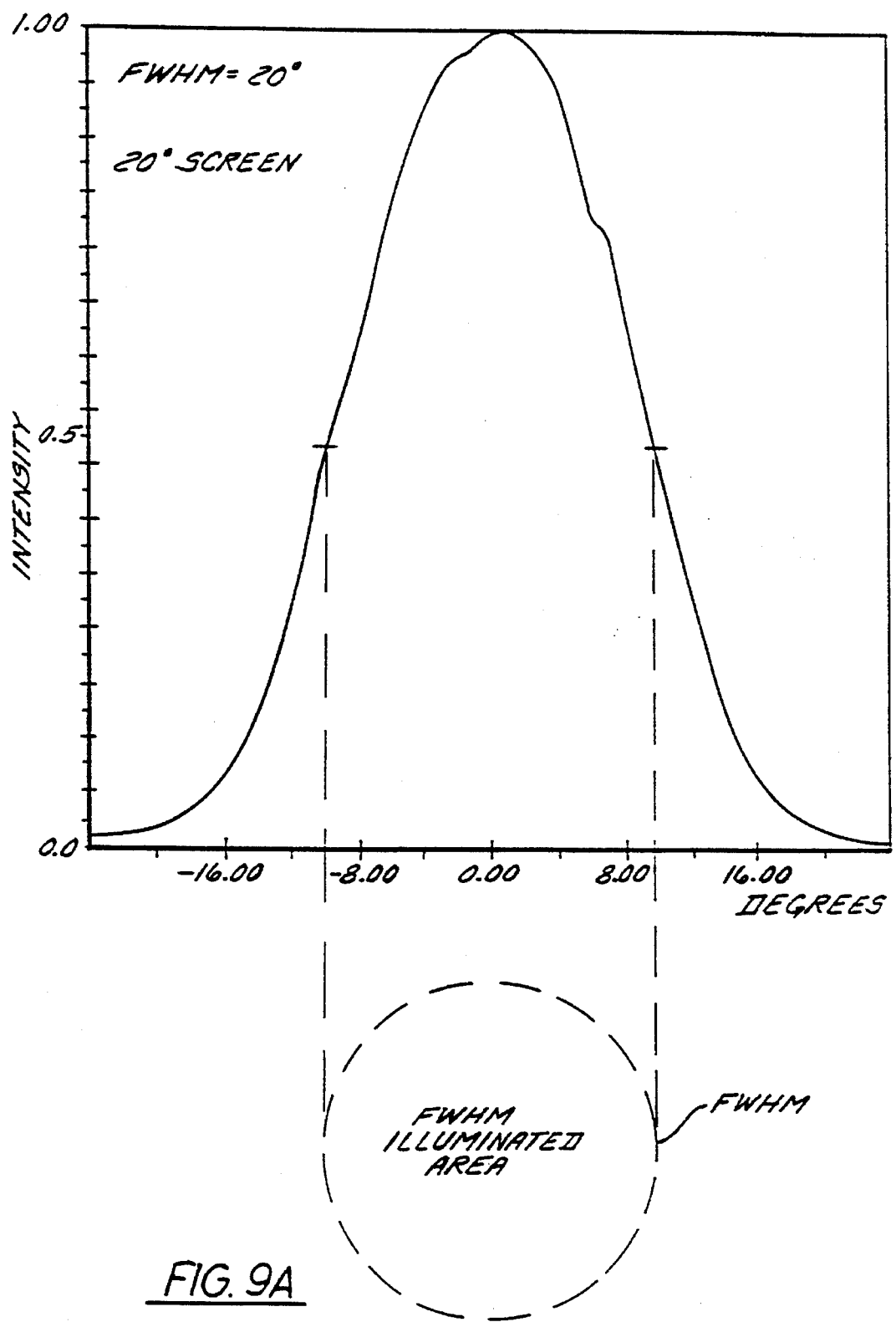
FIGS. 9A–E compare the FWHM (full width half maximum) of a 20° screen of the present invention (9A), a 10° screen of the present invention (9B), with a 20 micron ground glass diffuser (9C), an acetate diffuser (9D), and a lenticular diffuser (9E).

The high efficiency of the viewing screens of the present invention is highlighted by FIGS. 9A–E. Shown in FIG. 9A is a plot of power or light intensity through a viewing screen versus the angular spectrum of light output from the screen in degrees. The screen of the present invention which produced the output shown in FIG. 9A is a 20° circular screen. In other words, this screen has an FWHM of approximately 20° (19.55 actual). As can be seen from FIG. 9A, side lobe (the area outside the predefined output area or FWHM illuminated area) intensity is minimal thus conserving light energy.

Figure 9B:
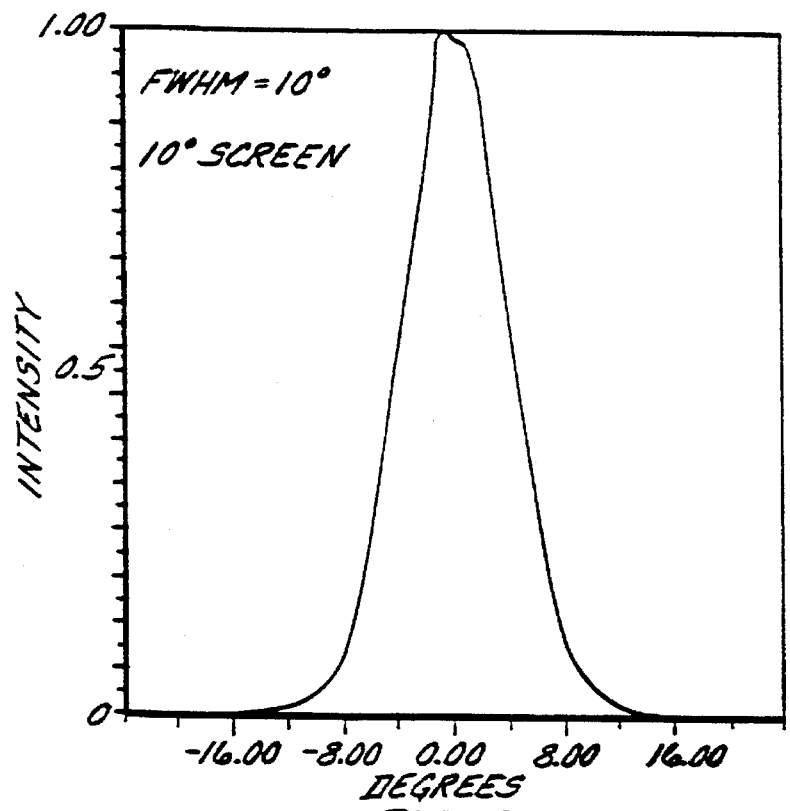

Referring now to FIG. 9B a screen having a FWHM of 10° is depicted. The minimal side lobes are especially apparent here where intensity drops virtually to zero at about 12° from center. This screen, as opposed to the screen which produced the output of FIG. 9A produces a very narrow circular spot of light. It can be appreciated that screens of an unlimited number of FWHM values may be produced in accordance with the present invention, thus making possible viewing screens having myriad outputs suitable for virtually any application.

Figure 9C:
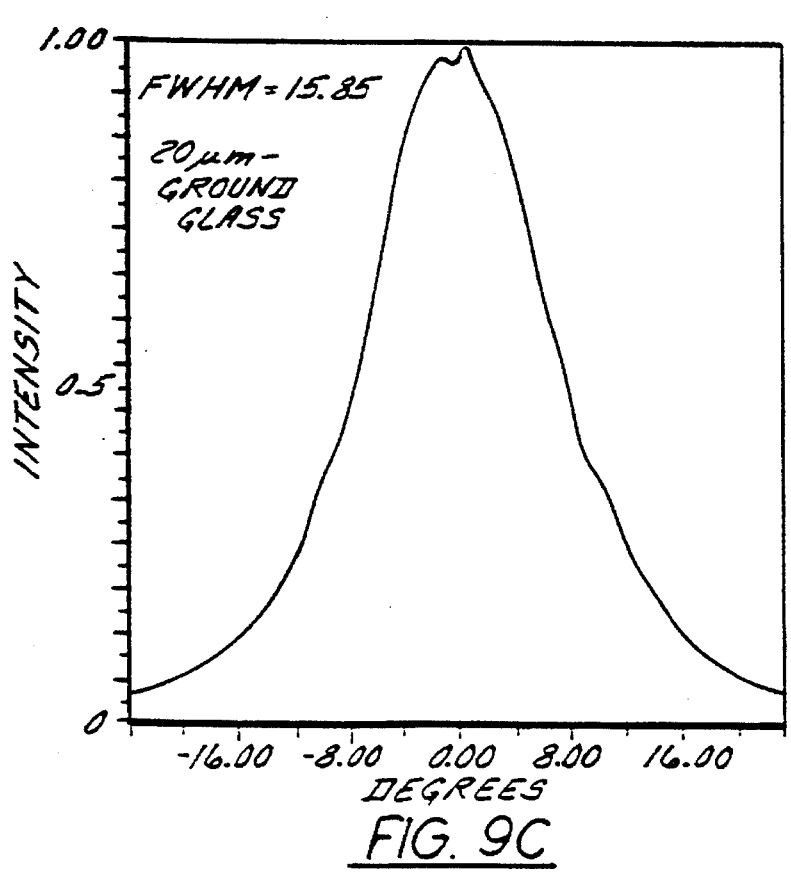
Figure 9D:
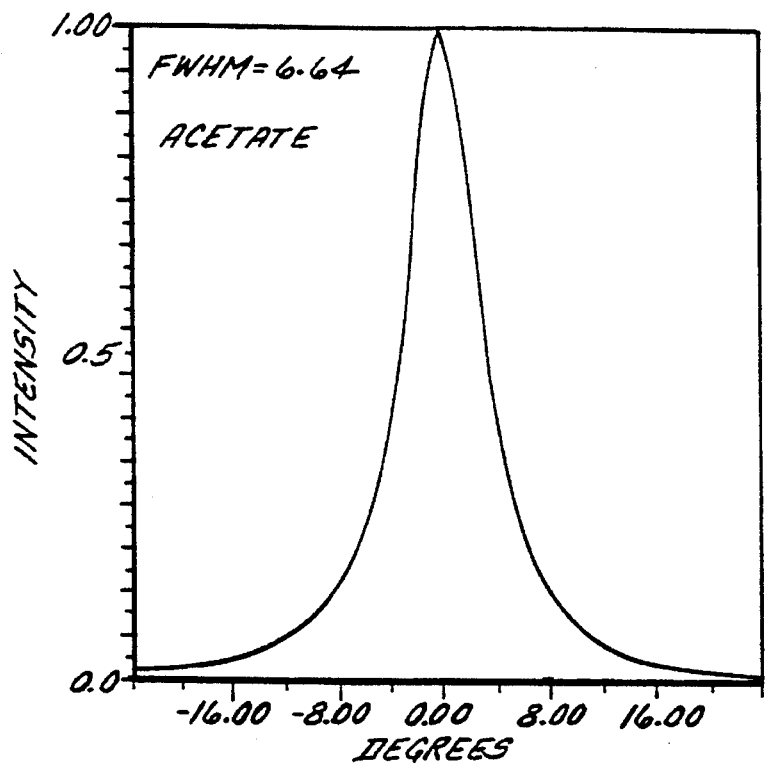
Figure 9E:
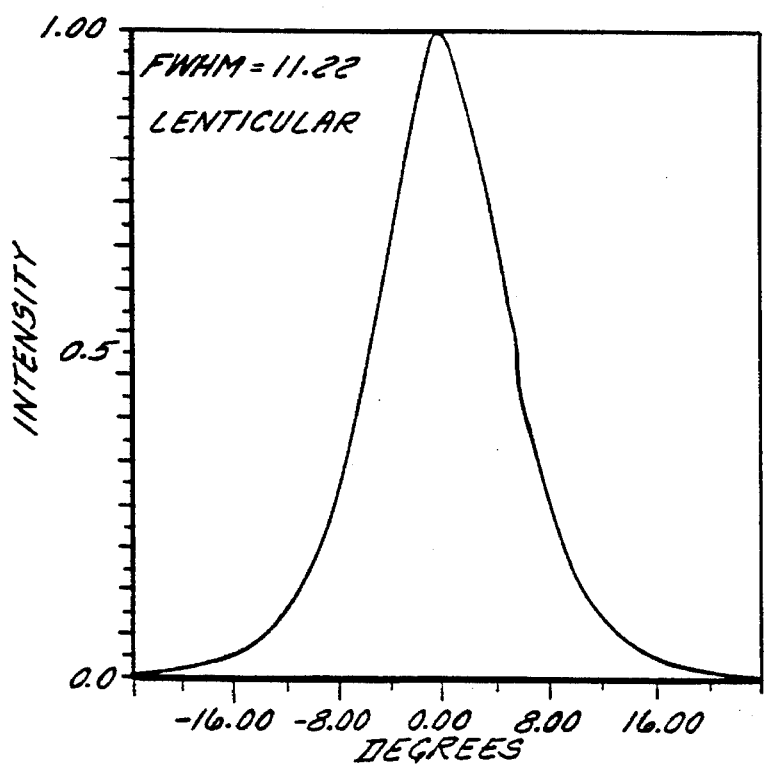

FIGS. 9C, D, and E respectively show, for comparison purposes, the output from a 20 micron ground glass diffuser, an acetate diffuser, and a lenticular diffuser. It is apparent that the side lobes in each of FIGS. 9C–E are larger which means that energy is wasted. Furthermore, it can be appreciated that because of the manner in which ground glass, acetate, and lenticular screens are produced, there is very little flexibility to produce a screen of those types having the exact output characteristics desired. The present invention is a significant advance over prior art screens which have an inability to tightly create and control the irregularities necessary to achieve the desired viewing output.

After recording, conventional development processes are used to develop the photosensitive medium. In the case of DCG, water-alcohol baths are used to swell the non-exposed areas to a greater degree than the exposed areas to create the surface structure. If photoresist is used, the exposed areas are removed and the unexposed areas remain intact when developed.

Once the photosensitive medium 24 is recorded and developed with the desired features using any of the above recording set-ups or equivalent ones, the photosensitive medium is processed as follows. The surface structure of the photosensitive medium 24 may preferably be rendered into a standard curable epoxy or silicone rubber or other molding agent. A release agent is preferably applied to the photosensitive medium prior to application of the epoxy to facilitate removal of the epoxy after curing. It is preferable to evaporate a release layer on the photosensitive medium such as oil or another suitable "slippery" release agent. The epoxy may be applied to the photosensitive medium and then a substrate, such as glass, metal, or plastic, placed on top of the epoxy to sandwich it between the photosensitive medium and the substrate. Alternatively, the epoxy may first be applied to a substrate which has been roughened somewhat to ensure that the epoxy sticks to it and then the epoxy sandwiched between the photosensitive medium and the substrate.

It is necessary to ensure that the epoxy is uniformly sandwiched between the photosensitive medium 24 and the substrate so that no air bubbles are present. After the sandwich is completed, the epoxy is then cured. This can be done under a UV lamp, or simply with the passage of time if it is time curing epoxy. Finally, the epoxy is separated from the photosensitive medium. If the photosensitive medium is DCG, additional epoxy replicas of it may be made, called "parent" replicas.

Standard mass production techniques can be used to create large numbers of exact copies of the parent (epoxy) replicas. Typically, the parent replicas may be subjected to conventional electroform processes, such as nickel electroform, to create a metal master which may then be used to emboss polyester or any thermoformable plastic. The type of reproduction used of course depends upon the number of copies desired and their ultimate use.

In larger viewing screens, it is obviously preferable to make the surface area of the photosensitive medium 24 as large as possible. In such a case, a nickel electroform master may be used to emboss a plurality of thermoformable plastic sheets which are then joined together to form a larger surface such as for a large viewing screen in an auditorium.

Embodiments of the present invention not disclosed herein are fully intended to be within the scope of the appended claims.

We claim:
1. A viewing screen produced by a process comprising:
   A. generating a micro-sculpted surface structure that controls the direction in which light propagates on a photosensitive medium having a refractive index by
      (i) generating random, disordered and non-planar speckle in said photosensitive medium using coherent light which has been diffused through a holographic diffuser and then directly transmitted to said photosensitive medium so as to define non-discontinuous and smoothly varying changes in said refractive index of said photosensitive medium which scatter collimated light into a controlled pattern with smooth brightness variation; and
      (ii) developing said photosensitive medium; and
   B. making a replica of said micro-sculpted surface structure that controls the direction in which light propagates,
   wherein light scattered from said replica of said micro-sculpted surface structure is characterized by said random, disordered and non-planar speckle.

2. A viewing screen having a normal axis, a horizontal direction, a vertical direction and a viewing area, said viewing screen comprising:
   a. a sheet of deformable material including a first micro-sculpted surface structure that controls the direction in which light propagates, said first micro-sculpted surface structure having been formed by replicating in said sheet of deformable material a second micro-sculpted surface structure that controls the direction in which light propagates, said second micro-sculpted surface structure having been formed in a photosensitive medium having a refractive index by (i) generating random, disordered and non-planar speckle in said photosensitive medium with coherent light that has been diffused through a holographic diffuser and then directly transmitted to said photosensitive medium so as to define non-discontinuous and smoothly varying changes in said refractive index of said photosensitive medium which scatter collimated light into a controlled pattern with smooth brightness variation and (ii) developing said photosensitive medium; and b. a reflective layer deposited on and conforming to said first micro-sculpted surface structure, whereby light incident on said viewing screen is reflected into said viewing area by said first micro-sculpted surface structure, wherein light scattered from said first micro-sculpted surface structure is characterized by said random, disordered and non-planar speckle.

3. The viewing screen as defined in claim 2 wherein said photosensitive medium comprises photoresist and said first micro-sculpted surface structure is made by recording said second micro-sculpted surface structure in said photosensitive medium, making a replica of said second micro-sculpted surface structure from said photosensitive medium, making a metal master of said replica from said replica, and embossing said sheet of deformable material with said metal master.

4. The viewing screen as defined in claim 2 wherein said photosensitive medium comprises dichromated gelatin.

5. The viewing screen as defined in claim 2 wherein said viewing area has a viewing area normal axis which is off said normal axis of said viewing screen.

6. The viewing screen as defined in claim 2 wherein said reflective layer returns said incident light structured so that said incident light is viewable in a well defined field of view up to ±89° from said viewing area normal axis in said horizontal direction and up to ±60° from said viewing area normal axis in said vertical direction.

7. In a liquid crystal display, the improvement comprising a viewing screen having a normal axis, a horizontal direction, a vertical direction and a viewing area, said viewing screen including:

a. a sheet of deformable material including a first micro-sculpted surface structure which controls the direction in which light propagates, said first micro-sculpted surface structure having been formed by replicating in said sheet of deformable material a second micro-sculpted surface structure that controls the direction in which light propagates, said second micro-sculpted surface structure having been formed in a photosensitive medium having a refractive index by (i) generating random, disordered and non-planar speckle in said photosensitive medium with coherent light that has been diffused through a holographic diffuser and then directly transmitted to said photosensitive medium so as to define non-discontinuous and smoothly varying changes in said refractive index of said photosensitive medium which scatter collimated light into a controlled pattern with smooth brightness variation and (ii) developing said photosensitive medium; and b. a reflective layer deposited on and conforming to said first micro-sculpted surface structure, whereby light incident on said viewing screen is reflected into said viewing area by said first micro-sculpted surface structure, wherein light scattered from said first micro-sculpted surface structure is characterized by said random, disordered and non-planar speckle.

8. In a laptop computer, the improvement comprising a viewing screen having a normal axis, a horizontal direction, a vertical direction and a viewing area, said viewing screen including:

a. a sheet of deformable material including a first micro-sculpted surface structure which controls the direction in which light propagates, said first micro-sculpted surface structure having been formed by replicating in said sheet of deformable material a second micro-sculpted surface structure that controls the direction in which light propagates, said second micro-sculpted surface structure having been formed in a photosensitive medium having a refractive index by (i) generating random, disordered and non-planar speckle in said photosensitive medium with coherent light that has been diffused through a holographic diffuser and then directly transmitted to said photosensitive medium so as to define non-discontinuous and smoothly varying changes in said refractive index of said photosensitive medium which scatter collimated light into a controlled pattern with smooth brightness variation and (ii) developing said photosensitive medium; and b. a reflective layer deposited on and conforming to said first micro-sculpted surface structure, whereby light incident on said viewing screen is reflected into said viewing area by said first micro-sculpted surface structure, wherein light scattered from said first micro-sculpted surface structure is characterized by said random, disordered and non-planar speckle.

9. A viewing screen for incident light comprising:

a sheet of embossable material in which a first micro-sculpted surface relief structure that controls the direction in which light propagates has been formed by replicating in said sheet of embossable material a second micro-sculpted surface structure that controls the direction in which light propagates, said second micro-sculpted surface structure having been formed in a photosensitive medium having a refractive index by (i) generating random, disordered and non-planar speckle in said photosensitive medium with coherent light which has been diffused through a holographic diffuser and then directly transmitted to said photosensitive medium so as to define non-discontinuous and smoothly varying changes in said refractive index of said photosensitive medium which scatter collimated light into a controlled pattern with smooth brightness variation and (ii) developing said photosensitive medium, said incident light being incident on and returned from said viewing screen to a viewing area, said viewing screen controlling the direction of said incident light that is emanating from said viewing screen to said viewing area and increasing brightness in said viewing area relative to an area outside said viewing area, wherein light scattered from said first micro-sculpted surface structure is characterized by said random, disordered and non-planar speckle.

10. The viewing screen as defined in claim 9 wherein said first micro-sculpted surface relief structure is characterized by peaks and valleys provided in a surface of said viewing screen so as to yield returned light that is selected from the group consisting of circular, elliptical, and rectangular.

11. The viewing screen as defined in claim 10 wherein said viewing area is elliptical and said peaks and valleys are straight and of random length.

12. The viewing screen as defined in claim 10 wherein said viewing area is rectangular and said micro-sculpted surface relief structure which controls the direction in which light propagates formed in said embossable material comprises two intersecting sets of peaks and valleys.

13. The viewing screen as defined in claim 9 having an output intensity which is constant over a field of view.

14. In a liquid crystal display, the improvement comprising a viewing screen for incident light including:

a sheet of embossable material in which a first micro-sculpted surface relief structure that controls the direction in which light propagates has been formed by replicating in said sheet of embossable material a second micro-sculpted surface structure that controls the direction in which light propagates, said second micro-sculpted surface structure having been formed in a photosensitive medium having a refractive index by (i) generating random, disordered and non-planar speckle in said photosensitive medium with coherent light which has been diffused through a holographic diffuser and then directly transmitted to said photosensitive medium so as to define non-discontinuous and smoothly varying changes in said refractive index of said photosensitive medium which scatter collimated light into a controlled pattern with smooth brightness variation and (ii) developing said photosensitive medium, said incident light being incident on and returned from said viewing screen to a viewing area, said viewing screen controlling the direction of said incident light that is emanating from said viewing screen to said viewing area and increasing brightness in said viewing area relative to an area outside said viewing area, wherein light scattered from said first micro-sculpted surface structure is characterized by said random, disordered and non-planar speckle.

15. In a laptop computer, the improvement comprising a viewing screen for incident light including:

a sheet of embossable material in which a first micro-sculpted surface relief structure that controls the direction in which light propagates has been formed by replicating in said sheet of embossable material a second micro-sculpted surface structure that controls the direction in which light propagates, said second micro-sculpted surface structure having been formed in a photosensitive medium having a refractive index by (i) generating random, disordered and non-planar speckle in said photosensitive medium with coherent light which has been diffused through a holographic diffuser and then directly transmitted to said photosensitive medium so as to define non-discontinuous and smoothly varying changes in said refractive index of said photosensitive medium which scatter collimated light into a controlled pattern with smooth brightness variation and (ii) developing said photosensitive medium, said incident light being incident on and returned from said viewing screen to a viewing area, said viewing screen controlling the direction of said incident light that is emanating from said viewing screen to said viewing area and increasing brightness in said viewing area relative to an area outside said viewing area, wherein light scattered from said first micro-sculpted surface structure is characterized by said random, disordered and non-planar speckle.

16. The liquid crystal display as defined in claim 7 wherein said reflective layer returns said incident light structured so that said incident light is viewable in a well defined field of view to ±89° from said viewing area normal axis in said horizontal direction and up to ±60° from said viewing area normal axis in said vertical direction.

17. The laptop computer as defined in claim 8 wherein said reflective layer returns said incident light structured so that said incident light is viewable in a well defined field of view up to ±89° from said viewing area normal axis in said horizontal direction and up to ±60° from said viewing area normal axis in said vertical direction.

18. The liquid crystal display as defined in claim 14 wherein said first micro-sculpted surface relief structure is characterized by peaks and valleys provided in a surface of said viewing screen so as to yield returned light that is selected from the group consisting of circular, elliptical, and rectangular.

19. The laptop computer as defined in claim 15 wherein said first micro-sculpted surface relief structure is characterized by peaks and valleys provided in a surface of said viewing screen so as to yield returned light that is selected from the group consisting of circular, elliptical, and rectangular.

20. The laptop computer as defined in claim 19 wherein said viewing area is elliptical and said peaks and valleys are straight and of random length.

* * * * *